United States Patent
Yamashita

(10) Patent No.: US 7,695,234 B2
(45) Date of Patent: Apr. 13, 2010

(54) DEVICE FOR TEMPORARILY LOADING, STORING AND UNLOADING A CONTAINER

(75) Inventor: Seishi Yamashita, Hiroshima (JP)

(73) Assignee: Rorze Corporation, Hiroshima (JP)

( * ) Notice: Subject to any disclaimer, the term of this patent is extended or adjusted under 35 U.S.C. 154(b) by 740 days.

(21) Appl. No.: 10/496,650

(22) PCT Filed: Dec. 4, 2002

(86) PCT No.: PCT/JP02/12731

§ 371 (c)(1), (2), (4) Date: May 25, 2004

(87) PCT Pub. No.: WO03/049181

PCT Pub. Date: Jun. 12, 2003

(65) Prior Publication Data

US 2005/0036856 A1    Feb. 17, 2005

(30) Foreign Application Priority Data

Dec. 4, 2001    (JP)    ............................. 2001-401451

(51) Int. Cl.
B65G 49/07    (2006.01)
(52) U.S. Cl. .................... 414/277; 414/940; 294/119.1; 187/411
(58) Field of Classification Search ................. 414/940; 187/409, 411; 294/119.1
See application file for complete search history.

(56) References Cited

U.S. PATENT DOCUMENTS 2,586,464 A * 2/1952 Hicks .......................... 187/409

(Continued)

FOREIGN PATENT DOCUMENTS

EP    1134641    9/2001

(Continued)

OTHER PUBLICATIONS

Overhead Intrabay Automation and Microstocking—a virtual fab case study by Philip Campbell and Glen Laitinen (Jul. 1997 IEEE/SEMI Advanced Semiconductor Manufacturing Conference, pp. 368-372).*

(Continued)

*Primary Examiner*—James Keenan
(74) *Attorney, Agent, or Firm*—Merek, Blackmon & Voorhees, LLC

(57) ABSTRACT

A device for temporarily loading, storing and unloading a container without deforming the container and affecting its contents. An enclosure (2) having struts (3) at both its left and right sides is provided. A support beam (4) of a transporter (10) that is provided with a pair of horizontal retaining fingers (13, 13) is attached in a vertically movable manner between the struts on the rear-surface side of the enclosure (2), and a plurality of horizontal shelves (20) is arranged between the struts on the rear-surface side of the enclosure with spaces (H) in a height direction of the container (19), the spaces being larger than the height dimension (h) of the container (19). Further, the retaining fingers (13, 13) of the transporter (10) are made to protrude toward the shelves (20) and the distance (L) between the pair of retaining fingers (13, 13) is made to be suitable for lifting the container.

8 Claims, 5 Drawing Sheets

U.S. PATENT DOCUMENTS

| | | | | |
|---|---|---|---|---|
| 3,032,377 A * | 5/1962 | Blase | ......................... | 187/409 |
| 4,271,932 A * | 6/1981 | Klein | ......................... | 187/409 |
| 4,598,798 A * | 7/1986 | Koppensteiner | ............. | 187/409 |
| 4,696,503 A * | 9/1987 | Collodel | ...................... | 294/88 |
| 4,716,991 A * | 1/1988 | Riechers | ..................... | 187/409 |
| 4,735,452 A * | 4/1988 | Nemoto | .................... | 294/119.1 |
| 4,865,375 A * | 9/1989 | Laub et al. | .................... | 294/88 |
| 4,968,077 A * | 11/1990 | Redmon et al. | ............... | 294/16 |
| 4,976,484 A * | 12/1990 | Nomaru et al. | .......... | 294/119.1 |
| 5,162,047 A * | 11/1992 | Wada et al. | ................ | 29/25.01 |
| 5,570,990 A * | 11/1996 | Bonora et al. | ................ | 414/543 |
| 5,628,604 A * | 5/1997 | Murata et al. | ............... | 414/283 |
| 5,980,183 A * | 11/1999 | Fosnight | ............... | 414/222.01 |
| 6,283,692 B1 * | 9/2001 | Perlov et al. | ................... | 414/222.01 |
| 6,579,052 B1 * | 6/2003 | Bonora et al. | .......... | 414/222.01 |
| 6,592,324 B2 * | 7/2003 | Downs et al. | ............... | 414/741 |
| 6,604,624 B2 * | 8/2003 | Hirata et al. | ................ | 198/494 |

FOREIGN PATENT DOCUMENTS

| | | |
|---|---|---|
| GB | 2306163 | 4/1997 |
| JP | 1-92110 | 4/1989 |
| JP | 1-93733 | 6/1989 |
| JP | 06-001257 | 6/1992 |
| JP | 09-221203 | 2/1996 |
| JP | 2000-3894 | 1/2000 |
| JP | 2000-012644 | 1/2000 |
| JP | 2000-44015 | 2/2000 |

OTHER PUBLICATIONS

English translation of JP 2000-012644, Jan. 14, 2000.
English translation of JP 01-093733, Jun. 20, 1989.

* cited by examiner

A

B

US 7,695,234 B2

DEVICE FOR TEMPORARILY LOADING, STORING AND UNLOADING A CONTAINER

FIELD OF THE INVENTION

The present invention relates to a device for temporarily loading, storing and unloading containers respectively having a fixed shape, and particularly to a device for temporarily storing containers cleanly, including containers containing flat precision electronic products. In this case, a plurality of shelves is mounted on the inside of an enclosure, and all operations, such as loading and storing and unloading to each shelf, are automatically controlled.

BACKGROUND OF THE INVENTION

Flat precision electronic products such as semiconductor wafers or substrates for liquid crystal display, and the like are made by inspection steps and all kinds of fabrication steps such as painting of photo-resist, thin film deposition, creation of oxidization film or nitration film, etching and heat treatment. In these steps, the flat precision electronic products are contained in clean containers to be transported. However, since the processing times needed for each step are not the same, generally, various plans for possibly decreasing waiting time are designed. For example, in a step whose throughput speed is slow, a plurality of shelves is provided to store the clean containers temporarily. In a step whose processing time is lengthy by necessity, the shelves are divided in rows to operate in parallel. In these circumstances, clean containers, which are used in semiconductor fabrication steps, are designed in a hand-held size, and manually stored on the shelves. However, since the precision electronic products hate contaminants, such as dust, it is desirable that the containers are transported and temporarily stored not manually but automatically.

A medium or small automatic storage device for cassettes, which transports substrates for semiconductor devices, has been already proposed in Japanese Provisional Publication No. 2001-298069. This device is so constructed that two docking stations for transferring the semiconductor wafers from the cassettes are provided on the bottom, a vertical transportation space is formed therebetween, and a plurality of shelves is arranged to left and right sides of the space over the docking stations. Here, a cassette mover moving vertically and horizontally holds a cassette and transports it inside the space, and then, places it on a docking station. However, this cassette mover comprises a horizontally movable vertical strut and an end effector that holds an upper handhold (flange) of a clean container. One end of the end effector is attached below the device, and the end effector serves as an elevator. When a heavy cassette (container) is started moving or stopped just holding by a strut, a large moment of inertia acts to cause oscillation and vibration. Besides, since the oscillation and the vibration can not be easily prevented, the transport speed is not increased and the cassette can not be precisely placed on a transfer stage. Moreover, the cassette mover is constructed so as to hold a protrusion of the upper side of the cassette. Then, the top surface of the cassette is deformed so as to expand, thereby increasing the capacity of the cassette and decreasing the internal pressure thereof. Therefore, when opening a cover, dust flows into the cassette together with outside air, and conditions in the container sometimes come under the influence of the dust.

An object of the present invention is to provide an automatic device for temporarily loading, storing and unloading a container, which never affects content materials of the container by a holding means deforming the container during transportation.

SUMMARY OF THE INVENTION

The present invention provides a device for temporarily loading, storing and unloading a plurality of containers, which comprises an enclosure having struts at both its left and right sides. And therein, a support beam is arranged between the struts on the front-surface side of the enclosure in a vertically movable manner, and a transporter having a pair of retaining fingers is mounted on the support beam so as to be horizontally movable and to suitably change the distance therebetween. Additionally, a plurality of horizontal shelves is arranged between the struts on the rear-surface side of the enclosure at a suitable interval in a height direction of the container. The interval is larger than the height of the container. The length between the rear-side struts and the transporter surface with the retaining fingers is larger than the depth of the container. The retaining fingers protrude toward the shelves by a fixed length, and move toward and away from one another, thereby holding the bottom surface of the container or the lower parts of the left and right side-surfaces thereof.

The device of the present invention can be embodied as follows.

The symmetrical retaining fingers comprise a cylinder whose single side is fixed so as to sway, a lever beam freely swaying on a fulcrum of a pin, working beams mounted on upper and lower positions sandwiched the pin, L letter shape parts mounted on tips of the working beams, and fingers mounted on tips of the L letter shape parts. And a protuberant length of the symmetrical retaining fingers is shorter than the depth of the container and longer than a half depth thereof.

Balance weights vertically moving interlocked with the support beam are mounted on the struts of the rear-surface side of the enclosure so as to move the support beam vertically in a balanced and smooth manner.

In addition, the support beam is connected to the balance weights by belts and vertically moved by using pulleys and a pair of motors so as to drive efficiently at a high speed.

Moreover, the support beam is mounted on at least one of the struts of the front-surface side of the enclosure through a folded type strain absorbing member so as to absorb most strain and stress in the vertical movement.

Furthermore, the shelves are arranged in a plurality of rows between the left and right struts of the enclosure so that the distance between adjoining shelves is at least larger than the width of a container. Because of this, lots of containers are loaded and stored efficiently, and transported rapidly and precisely.

In addition, the struts, the support beam and the transporter are made of aluminum. Because of this, the whole device is lightened, anticorrosion improves, and contamination to the flat precision electronic products, such as semiconductor wafers, is effectively prevented.

BRIEF DESCRIPTION OF THE DRAWINGS

FIG. 4A shows the pair of retaining fingers without a cassette, and FIG. 4B shows the retaining fingers holding a cassette.

PREFERRED EMBODIMENT OF THE INVENTION

Figure 1:
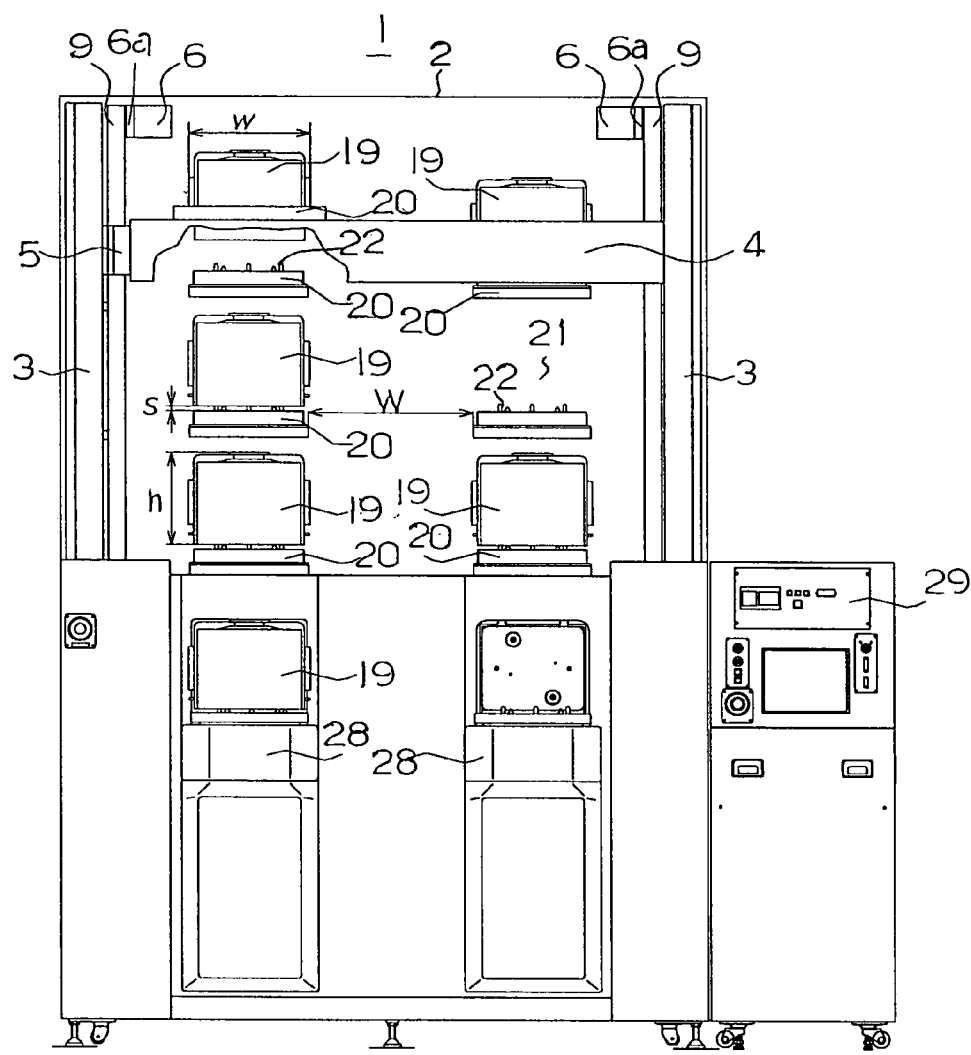
FIG. 1 is a partially cutaway front elevation of the whole device.

Embodiments in the present invention will be explained in detail with reference to the drawings.

In each of drawings, 1 is a device for temporarily loading, storing and unloading a container in accordance with the present invention. Here, 2 is an enclosure of the device 1, which has struts 3, 3, 3, 3 at both its left and right sides. The capacity of the enclosure 2 is constant, for example, its length, width and height being made 1 m, 2 m and 3 m, respectively. Numeral 4 is a support beam across a space between the struts 3, 3 on the front-surface side of the enclosure 2. Engaging members 5, 5 are provided on both left and right side ends of the support beam 4, and longitudinal narrow grooves 3a, 3a are formed on facing inside surfaces of the struts 3, 3. Here, the engaging members 5, 5 are engaged in the narrow grooves 3a, 3a, vertically moving the support beam 4 due to the following driving means.

A pair of motors 6, 6 are fitted on the upper sides of the facing inside surfaces of the struts 3, 3, and drive pulleys 7, 7 are fitted on the other struts 3, 3, where they correspond to pulleys 6a, 6a of the motors 6, 6.

Balance weights 8, 8 are engaged in the longitudinal narrow grooves 3a, 3a of the facing inside surfaces of the other struts 3, 3 opposite to the struts 3, 3 for vertically guiding the support beam 4, and vertically move thereon. The balance weights 8, 8 are connected by belts 9, 9, dividing the whole weight, including the support beam 4 and a transporter, into two in a balanced manner. In this way, the motors 6, 6 enable the support beam 4 to move vertically by a small horsepower.

Figure 3:
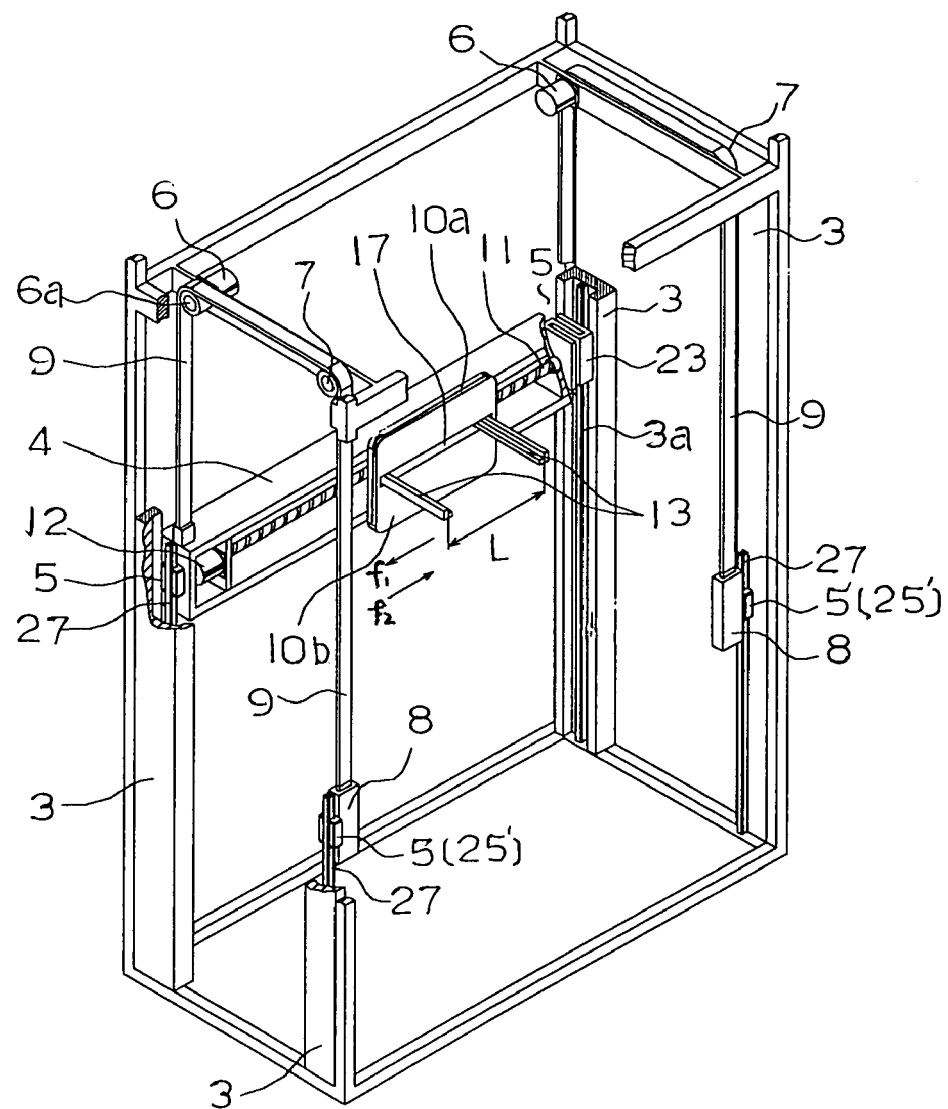
FIG. 3 is an explanation view showing the state that an important part of the present invention is seen from the rear side of FIG. 1.

A transporter 10 is fitted on the support beam 4 so as to reciprocate horizontally. As shown in FIG. 3, a screw axis 11 is provided horizontally inside the support beam 4, and the transporter 10 is driven by a motor that is provided at one end of the screw axis 11.

Accordingly, normal rotations or reverse rotations of the motor 12 move the transporter 10 laterally on the support beam 4 (namely, in a direction f1 or a direction f2).

Figure 4:
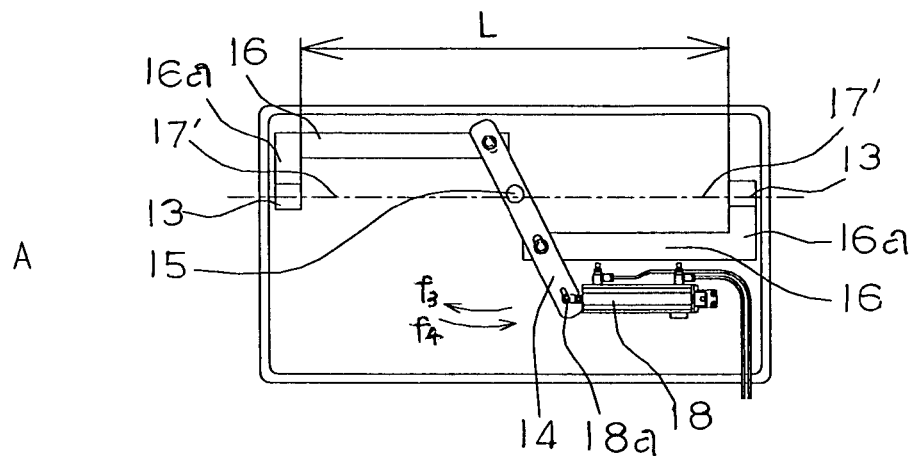
FIGS. 4A and 4B are schematic views showing the construction for holding a cassette in a transporter.
Figure 4:
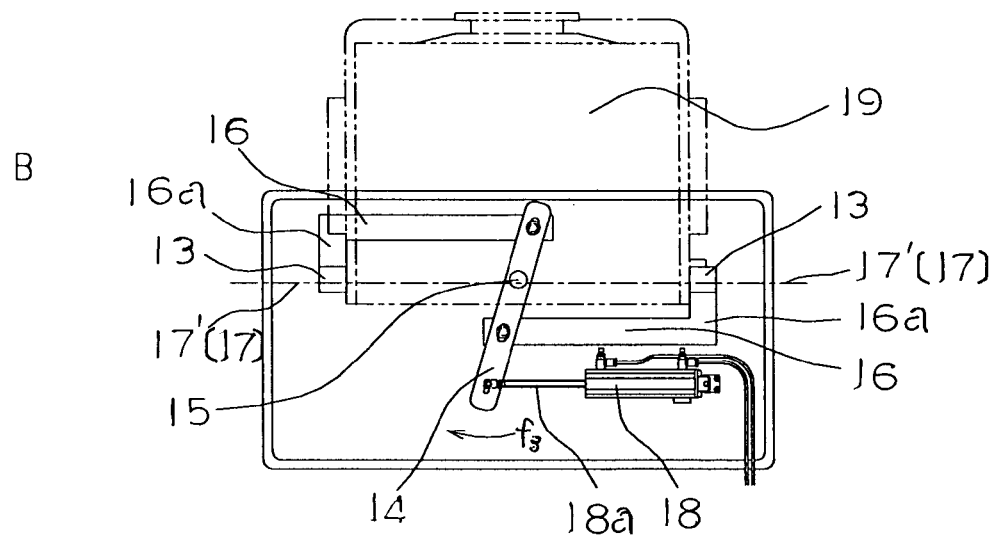

The transporter 10 comprises a base plate 10a whose back-surface side is provided with a female thread body (not illustrated). The base plate 10a is made in a fixed size (length: 30 cm, width: 50 cm) and the female thread body is engaged with the screw axis 11. Besides, a pair of horizontal retaining fingers 13, 13 are mounted on the front-surface side of the base plate 10a so as to expand and contract a horizontal distance L therebetween to hold a container. This action is shown in FIGS. 4A and 4B. FIG. 4A is an explanation view showing the state that a front-surface cover 10b is removed from the transporter 10. In the drawings, 14 is a lever beam freely swaying on a fulcrum of a pin 15, and working beams 16, 16 are mounted in upper and lower positions sandwiching the pin 15 equidistantly. The tips of the working beams 16, 16 are formed into L-shaped parts 16a, 16a point-symmetrical to the pin 15. A line passing through the parts 16a, 16a (which is illustrated in a dashed line 17') is harmonized with a slit 17 that is provided on the front-surface cover 10b. The retaining fingers 13, 13 are fitted on the L-shaped parts 16a, 16a so as to pass through the slit 17 and protrude from the upper surface thereof by a fixed length (about 30 cm). Numeral 18 is an air cylinder for swaying the lever beam 14 in directions f3, f4 on the fulcrum of the pin 15. One of the ends of the air cylinder 18 is free-shakably secured on the base plate 10a, and a piston rod 18a, which is the other end, is freely secured on the bottom part of the lever beam 14. FIG. 4B shows the state in which the retaining fingers 13, 13 slide inwardly inside the slit 17 and hold a container 19 at the front-surface cover 10b side. Therein, the air cylinder 18 works, and then, the piston rod 18a protrudes by a fixed length and the lever beam 14 sways in the direction f3, thereby contracting the distance L between the left and right L-shaped parts 16a, 16a on the dashed line 17'.

In the present invention, the transporter 10 is mounted on the support beam 4 so that the fingers, 13, 13 protrude inwardly into the enclosure 2. A plurality of shelves 20 is installed on the inside of the enclosure 2 facing the support beam 4 where the fingers 13, 13 protrude so as to accept and temporarily store the container 19. Specifically, a wallboard 21 is fitted between the rear-side struts 3, 3, and thereon, a plurality of shelves 20 is arranged. In this case, the shelves 20 are arranged in a vertical direction of the enclosure 2 each with an interval H larger than the height h of the container 19. Besides, in view of the following transferring and carrying out operations, the shelves 20 are arranged not in a row but in a plurality of rows in a horizontal direction. In the embodiments shown in FIGS. 1, 2, the shelves are arranged in two rows. In this case, the distance W between the adjoining rows is larger than the width w of the container 19. Besides, positioning pins 22 are provided on each shelf 20, and each interfitted to a conical indentation (not-illustrated) provided on the bottom of the container 19. According to this, the container 19 can be positioned on the shelf 20 automatically and precisely. Besides, the container 19 is stored over the shelf 20; specifically, an interval is formed between the bottom of container and the top of the shelf. Although the interval is useful for the fingers 13, 13 to be inserted when transferring or unloading the container, the positioning pins 22 are not necessarily needed in the present invention because they are substitutable.

Figure 5:
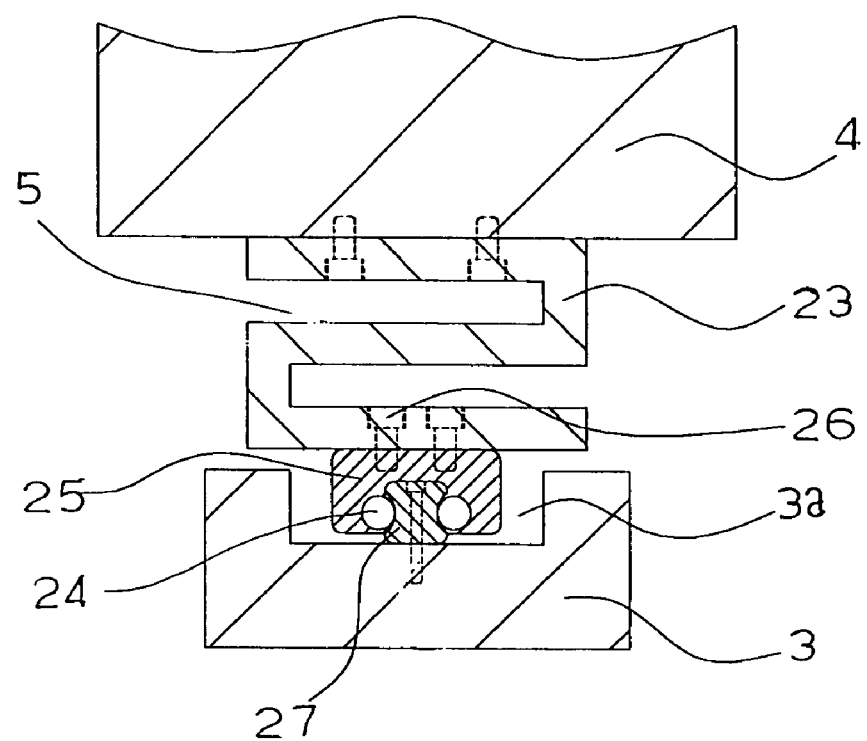
FIG. 5 is a partial detailed sectional view of a folded strain absorbing member introduced into the present invention.

In case of a general container being on the market and including processed materials such as wafers, the total weight of the container is about 10 kg. When loading, storing and unloading the container by supporting it and moving the fingers 13, 13 in the directions f1, f2 of the support beam 4, the horizontality and the vertical movement of the support beam 4 is adversely influenced due to dynamic eccentric loading. However, in the present invention, as shown in FIG. 5, a folded strain-absorbing member 23 is fitted as an engaging member 5 of the end of the support beam 4. The folded strain-absorbing member 23 is so formed that a metallic plate is bent in multiple stages, and therethrough, the support beam 4 is engaged with the narrow groove 3a. A sliding member 25 having a ball bearing 24 on its inside periphery is mounted on the strain-absorbing member 23 with a bolt-screw 26 so as to envelop a rail member 27 fitted on the narrow groove 3a.

In the present invention, an additional folded strain-absorbing member 23 may be provided on the other end of the support beam 4 as a different engaging member 5. The strain-absorbing member 23 is necessary for a sliding area between the support beam 4 and the strut 3, not necessary for a sliding area between the balance weight 8 and the strut 3. That is, as shown in FIG. 3, the engaging member 5 of the balance weight 8 is so formed that a sliding member 25' mounted on its side end is directly engaged with the rail member 27 of the strut 3.

A load port (docking station) 28 is arranged at the bottom of the inside of the enclosure 2, and the containers 19 transported into the enclosure 2 from time to time are suitably placed on the shelves 20 to be temporarily stored. Here, the container 19 is timely transferred on a stage 28a of the load port 28, and available for necessary treatments and inspections. In addition, a regulator 29 is provided to order the operation of the whole device and the handling of the container 19.

Next, a using example and an operation of the device will be explained.

The container 19 including the processed materials thereinside is transported from the outside of the device into the enclosure 2 and loaded on a shelf 20(m) of the highest row through a suspended automatic carrier device (not-illustrated). The support beam 4 vertically moves and the transporter 10 works, thereby transporting the container 19 to the stage 28a. Then, the processed materials inside the container receive necessary processes by being ejected in order. When all processes have been finished, the container 19 is returned to a different shelf 20(n) of the highest row by the support beam 4 and the transporter 10, waiting to be carried out to another point by a different suspended automatic carrier device (not-illustrated). When a second container 19 is placed on shelf m while a first container is still undergoing processing at stage 28a, then support beam 4 and transporter 10 are operated to move the second container to another empty shelf 22. This operation maximizes the availability of shelf m for delivery of containers from the suspended automatic carrier device.

When it is difficult to empty the shelf (m) within a fixed time in the above operation, a different adjoining shelf of the highest row is used as a preparatory shelf. The shelf (n) for carrying out is similarly made. Here, the shelves can be formed in three rows or four rows in addition to the illustrated examples.

Figure 2:
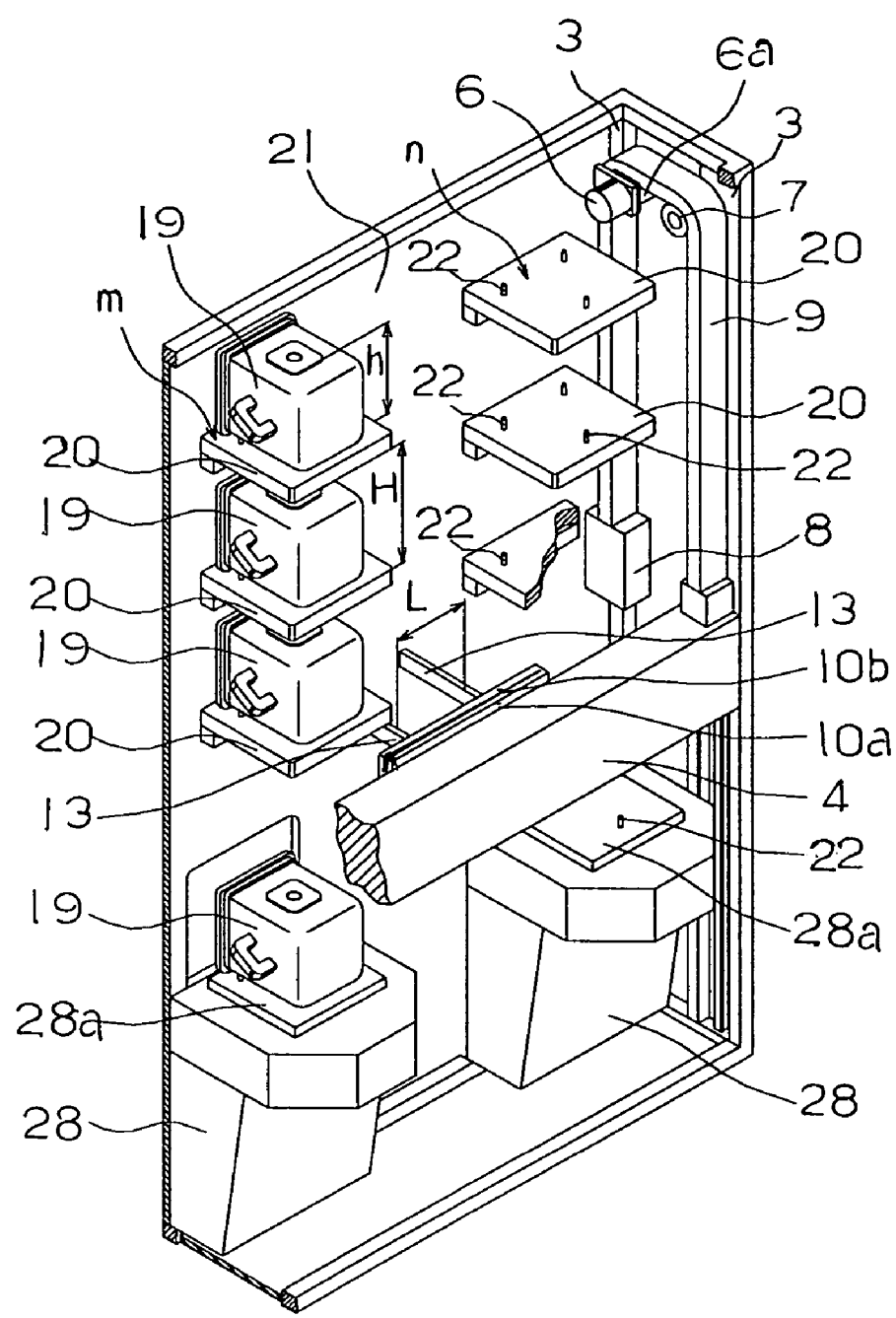
FIG. 2 is a partially cutaway perspective view showing the front and left side of FIG. 1 cut off.

In the present invention, when the fingers 13, 13 of the transporter 10 hold the container 19, they hold the bottom end parts of the left and right side-wall surfaces of the container 19 or the bottom surface part thereof. That is, when the top surfaces of the fingers 13, 13 are flat as shown in FIG. 2, they touch at left and right ends of the bottom surface part of the container 19 and lift it up. On the other hand, when the fingers 13, 13 are formed in L-shaped sections as shown in FIG. 3, the angles of the sections are aligned with the corners of the lower left and right side-wall surfaces of the container 19 and hold them. Besides, when using a marketable container on which hand-flanges are formed so as to horizontally protrude from the left and right side-wall surfaces, the fingers 13, 13 touch at the bottoms of the flanges and hold them.

Three positioning pins 22 are respectively provided on the top surfaces of the shelves 20 and the stages 28a of the load ports 28 so as to vertically protrude therefrom by about 3 cm. On the other side, three conical indentations (not illustrated) correspondent to the pins 22 are formed on the bottom surfaces of each container. Accordingly, when the fingers 13, 13 release the container 19 from holding on the pins 22, the container 19 is automatically positioned and loaded at the suitable fixed position.

In this case, there occurs a space s of 1 cm between the top surface of the shelf 20 or the top surface of the stage 28A and the bottom surface of the container 19 (see FIG. 1). Therefore, when taking out the container 19, the fingers 13, 13 are inserted into the space s and hold up the bottom of the container. A series of operations can be smoothly achieved thanks to the space s.

Besides, in the case of a container having horizontally protuberant flanges on the undersides of left and right side-wall surfaces, the fingers 13, 13 may touch the bottoms of the flanges and hold up the container.

INDUSTRIAL APPLICABILITY

According to the present invention, the containers including processed materials, which sequentially need some different processes on different stages, are treated in an effective production line by being temporarily stored in an assembly line. That is, when it is required that loading, temporarily storing, transferring on the load port and unloading of the container should be performed within a fixed time set beforehand with relation to the processes on other stages and transporting time, the device of the present invention can take proper steps to meet the situation and put containers back to the prescribed production line by performing required various processes without loss of time. Accordingly, the whole assembly line operates exactly and the operation is performed smoothly.

Additionally, the present device is excellent in that the processes can be achieved by a few load ports, and the whole device can be miniaturized, thereby diminishing the cost. Moreover, since the holding of the container never causes transformation of the outward form of the container at all, the processed materials therein are not influenced at all, not only before processing but after processing. Accordingly, the quality can be improved. Furthermore, in the case of the device being made of aluminum, the whole device is made light in weight and superior in anticorrosion and pollution control for the processed materials.

The invention claimed is:

1. A device for temporarily loading, storing and unloading a container, comprising:
    an enclosure having a front-surface side, a rear-surface side, a left side, a right side and struts at both the left and right sides, including struts at the front-surface side and struts at the rear-surface side;
    a support beam mounted in a vertically movable manner between the struts at the front-surface side of the enclosure;
    a transporter movable horizontally on the support beam, the transporter having a pair of symmetrical retaining fingers extending from a transporter surface and defining a distance therebetween;
    a plurality of shelves arranged horizontally and vertically between the struts at the rear-surface side of the enclosure, with vertical spaces between the shelves in a height direction of the container, the spaces being larger than the height of the container, a length between the struts at the rear-surface side and said transporter surface being larger than the depth of the container; and
    a plurality of positioning pins with a fixed height protruding from the shelves so as to separate the container from the shelves; and
    a strain absorbing member having a tortuous, back-and-forth shape, the strain absorbing member being provided at least on one of the struts of the front-surface side of the enclosure. wherein the support beam is mounted through the strain absorbing member, and
    wherein the retaining fingers are movable to expand and contract the distance therebetween so as to be adapted to be inserted from right and left sides under a bottom of the container loaded on one of the shelves, and then, support right and left portions of the bottom or an underside of a flange provided on right and left side walls of the container, and thus, remove the container from said one of the shelves by lifting.

2. A device for temporarily loading, storing and unloading a container as claimed in claim 1, wherein said symmetrical retaining fingers comprise a cylinder having a fixed end, a lever beam freely swaying on a fulcrum of a pin, working beams mounted at upper and lower positions on opposite sides of the pin, L-shaped parts mounted on tips of the working beams, and fingers mounted on tips of the L-shaped parts.

3. A device for temporarily loading, storing and unloading a container as claimed in claim 1, wherein a protuberant length of said symmetrical retaining fingers is shorter than the depth of the container and longer than a half depth thereof.

4. A device for temporarily loading, storing and unloading a container as claimed in claim 1, further comprising balance weights provided on the struts of the rear-surface side of the enclosure, wherein the balance weights vertically move interlocked with vertical movement of the support beam.

5. A device for temporarily loading, storing and unloading a container as claimed in claim 1, wherein the vertical movement is performed through a pair of motors, pulleys and belts.

6. A device for temporarily loading, storing and unloading a container as claimed in claim 1, wherein the shelves are arranged in a plurality of vertical rows, and the distance between shelves in adjacent rows is at least larger than a cross width of a container.

7. A device for temporarily loading, storing and unloading a container as claimed in claim 1, wherein the struts, the support beam and the transporter are made of aluminum.

8. A device for temporarily loading, storing and unloading a container as claimed in claim 1, wherein the container is for containing flat boards for precision electronic parts.

* * * * *